United States Patent
Huang et al.

(10) Patent No.: US 11,929,745 B1
(45) Date of Patent: Mar. 12, 2024

(54) CLOCK GENERATOR

(71) Applicant: Himax Technologies Limited, Tainan (TW)

(72) Inventors: Yu-Shyang Huang, Tainan (TW); Sheng-Zhe Lin, Hsinchu (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 18/110,609

(22) Filed: Feb. 16, 2023

(51) Int. Cl.
*H03K 3/0231* (2006.01)
*H03K 3/011* (2006.01)
*H03K 5/134* (2014.01)

(52) U.S. Cl.
CPC .......... *H03K 3/0231* (2013.01); *H03K 3/011* (2013.01); *H03K 5/134* (2014.07)

(58) Field of Classification Search
CPC ....... H03K 3/0231; H03K 3/011; H03K 5/134
See application file for complete search history.

(56) References Cited

U.S. PATENT DOCUMENTS

| | | | |
|---|---|---|---|
| 2016/0191067 A1* | 6/2016 | Samala | H03B 5/24 331/25 |
| 2017/0255220 A1* | 9/2017 | Sivakumar | H03B 5/04 |
| 2022/0413532 A1* | 12/2022 | Gupta | G05F 3/30 |

* cited by examiner

*Primary Examiner* — Jeffrey M Shin
(74) *Attorney, Agent, or Firm* — Donald E. Stout; Stout, Uxa & Buyan, LLP

(57) ABSTRACT

A clock generator includes a resistor-capacitor-based voltage-controlled oscillator (RC-based VCO) that generates an output signal with oscillation frequency controlled by an input voltage at an input node; and a temperature compensator that generates the input voltage to compensate change of the oscillation frequency associated with a change in temperature.

12 Claims, 5 Drawing Sheets

CLOCK GENERATOR

BACKGROUND OF THE INVENTION

1. Field of the Invention

The present invention generally relates to a clock generator, and more particularly to a clock generator with low temperature coefficient.

2. Description of Related Art

A clock generator is an electronic oscillator that produces a clock signal with an accurate reference frequency for use in synchronizing operation in a system. A voltage-controlled oscillator (VCO) is an electronic oscillator with oscillation frequency that is controlled by a voltage input, and is commonly adaptable to implementing the clock generator.

For system-on-chip (SoC) integrated circuits, the clock signal may be provided by an off-chip crystal oscillator. Nevertheless, it is desirable to use an on-chip oscillator to generate the required clock signal in considerations of cost and size reduction. However, the on-chip oscillator commonly suffers large frequency variation due to process, voltage and temperature (PVT) variation effects.

A need has thus arisen to propose a novel scheme to reduce frequency variation of a clock generator, particularly the on-chip oscillator, under PVT variations.

SUMMARY OF THE INVENTION

In view of the foregoing, it is an object of the embodiment of the present invention to provide a clock generator with low temperature coefficient to minimize the relative change of the oscillation frequency associated with a given change in temperature, in addition to being unaffected under process, voltage and temperature (PVT) variations.

According to one embodiment, a clock generator includes a resistor-capacitor-based voltage-controlled oscillator (RC-based VCO) and a temperature compensator. The RC-based VCO generates an output signal with oscillation frequency controlled by an input voltage at an input node. The temperature compensator generates the input voltage to compensate change of the oscillation frequency associated with a change in temperature.

DETAILED DESCRIPTION OF THE INVENTION

Figure 1A:
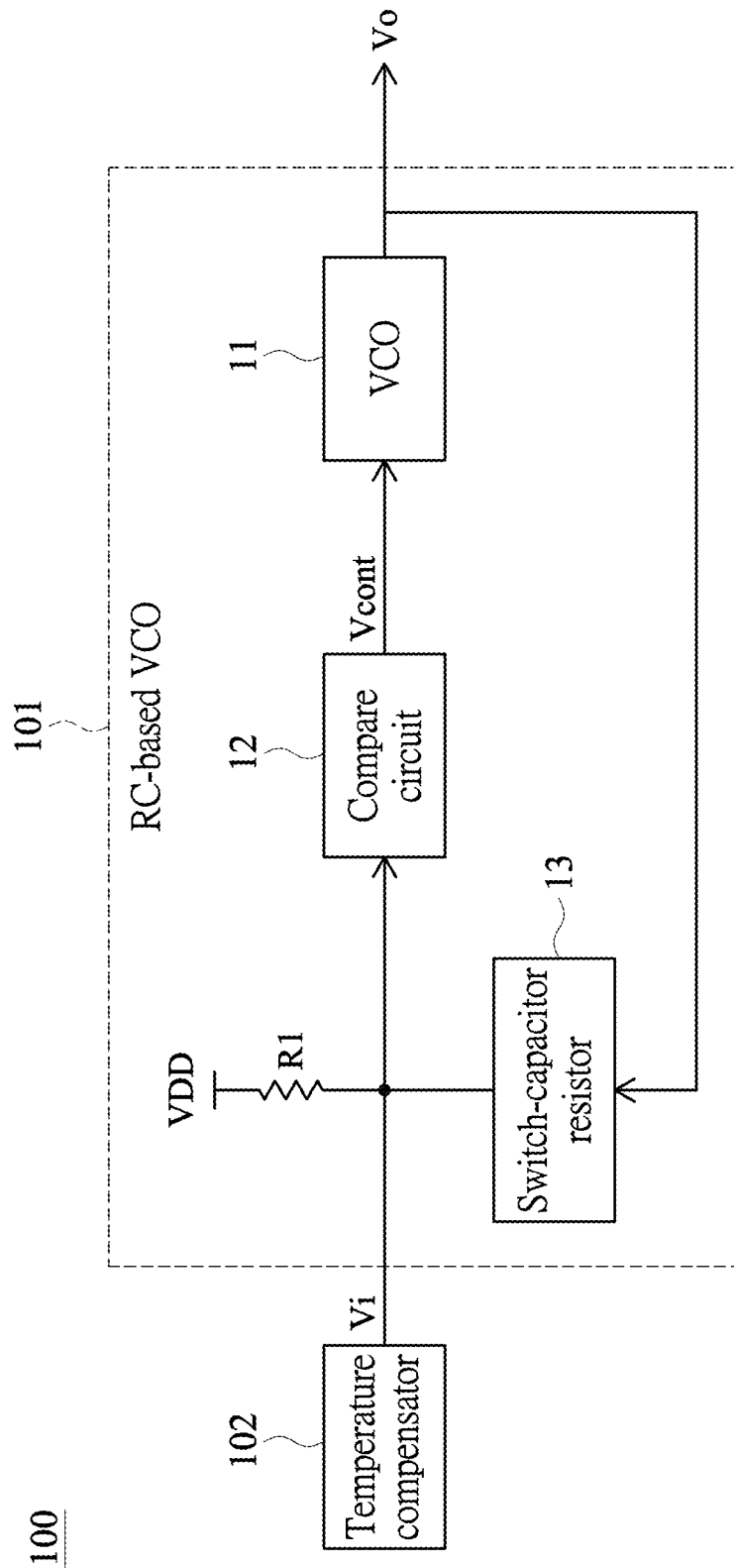
FIG. 1A shows a block diagram illustrating a clock generator with low temperature coefficient according to one embodiment of the present invention.
Figure 1B:
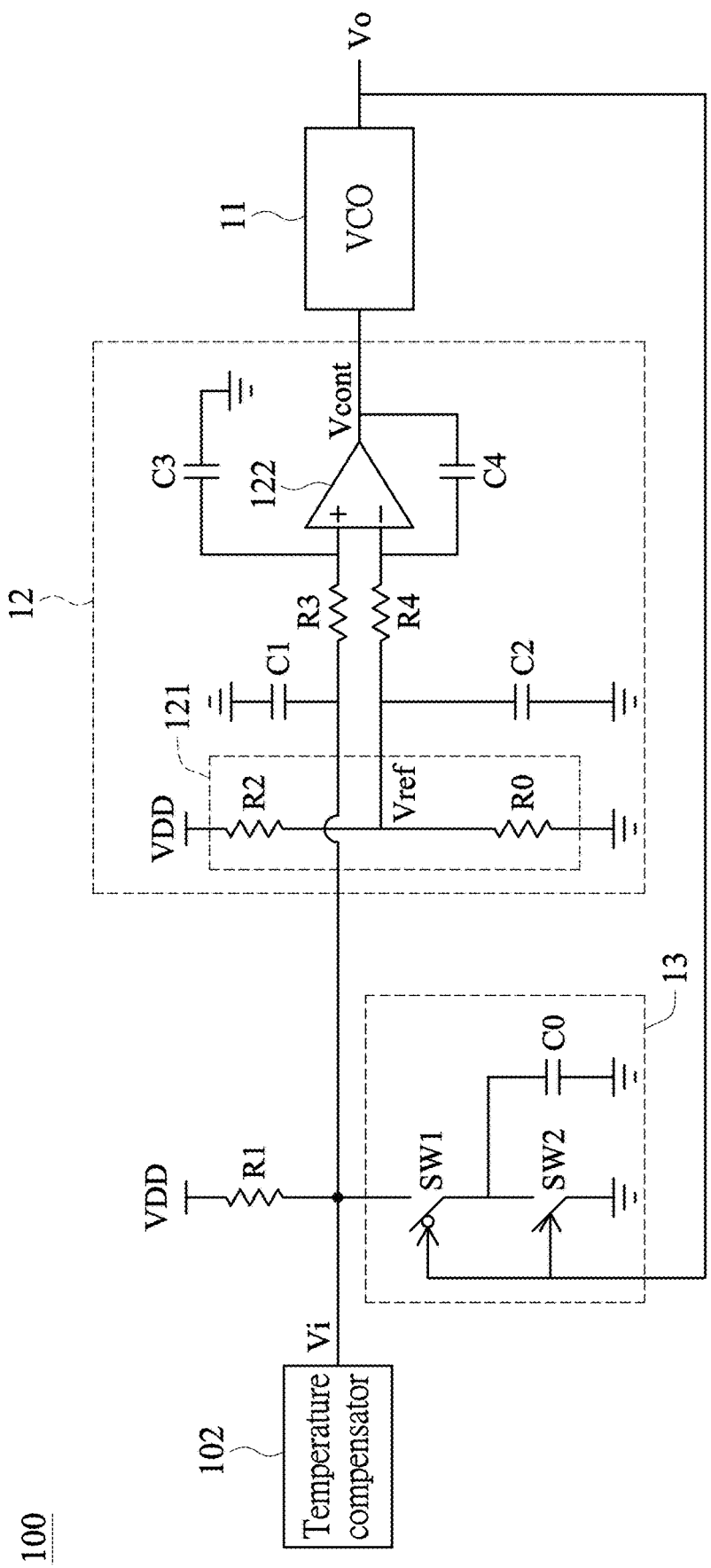
FIG. 1B shows a circuit diagram illustrating the clock generator of FIG. 1A.

FIG. 1A shows a block diagram illustrating a clock generator 100 with low temperature coefficient according to one embodiment of the present invention, and FIG. 1B shows a circuit diagram illustrating the clock generator 100 of FIG. 1A.

In the embodiment, the clock generator 100 may include a resistor-capacitor-based voltage-controlled oscillator (RC-based VCO) 101 configured to generate an output signal Vo with oscillation frequency controlled by an input voltage Vi. According to one aspect of the embodiment, the clock generator 100 may include a temperature compensator 102 configured to generate the input voltage Vi to compensate change of the oscillation frequency associated with a change in temperature.

Specifically, the RC-based VCO 101 may include a voltage-controlled oscillator (VCO) 11 configured to generate the output signal Vo with oscillation frequency controlled by a control voltage Vcont. In one exemplary embodiment, the VCO 11 may include a ring oscillator.

Figure 2:
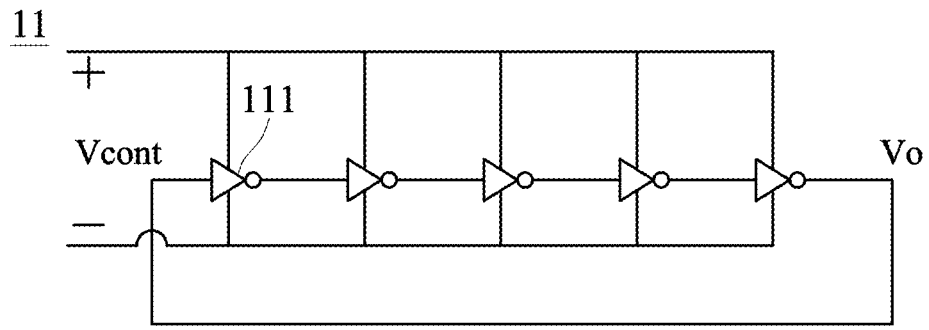
FIG. 2 shows a circuit diagram illustrating a ring oscillator for the VCO of FIG. 1A.

FIG. 2 shows a circuit diagram illustrating a ring oscillator for the VCO 11 of FIG. 1A. Specifically, the ring oscillator may include an odd number of inverters 111 (five inverters are exemplified here) connected in series and an output (i.e., Vo) of the last inverter 111 is fed back into the first inverter 111 to form a chain or ring.

Referring back to FIG. 1A, the RC-based VCO 101 of the embodiment may include a compare circuit 12 configured to generate the control voltage Vcont (for the VCO 11) by comparing the input voltage Vi with a reference voltage Vref. Specifically, as shown in FIG. 1B, the compare circuit 12 may include a voltage divider 121 configured to generate the reference voltage Vref. In the embodiment, the voltage divider 121 may include a top resistor R2 and a bottom resistor R0 connected in series between a supply voltage VDD and ground. The compare circuit 12 may include a comparator 122 (e.g., composed of an operational amplifier) configured to compare the input voltage Vi with the reference voltage Vref. Specifically, the comparator 122 may have a non-inverting input node coupled to receive the input voltage Vi, via a resistor R3, and an inverting input node coupled to receive the reference voltage Vref, via a resistor R4. The compare circuit 12 of the embodiment may include a capacitor C1 connected between the input voltage Vi and the ground and configured to stabilize the voltage inputted to the non-inverting input node of the comparator 122, and a capacitor C2 connected between the reference voltage Vref and the ground and configured to stabilize the voltage inputted to the inverting input node of the comparator 122.

In the embodiment, the RC-based VCO 101 may include a pull-up resistor R1 and a switched-capacitor resistor 13 connected in series between the supply voltage VDD and the ground, and interconnected at an input node coupled to receive the input voltage Vi.

Specifically, as shown in FIG. 1B, the switched-capacitor resistor 13 may include a first switch SW1 and a second switch SW2 connected in series between the input node and the ground. The second switch SW2 is controlled by the output signal (from the VCO 11) and the first switch SW1 is controlled by an inverted output signal. The switched-capacitor resistor 13 may include a capacitor C0 connected between an interconnected node (between the first switch SW1 and the second switch SW2) and the ground.

According to the RC-based VCO 101 as disclosed above, the switched-capacitor resistor 13 has a resistance being conversely proportional to the oscillation frequency of the output signal Vo. Therefore, the resistance of the switched-capacitor resistor 13 decreases with increasing oscillation frequency (of the output signal Vo). In operation, when the oscillation frequency of the output signal Vo increases, the voltage at the non-inverting input node of the comparator 122 decreases accordingly, thereby decreasing the control voltage Vcont (at an output node of the comparator 122) and therefore slowing down the oscillation frequency of the output signal Vo.

Figure 3:
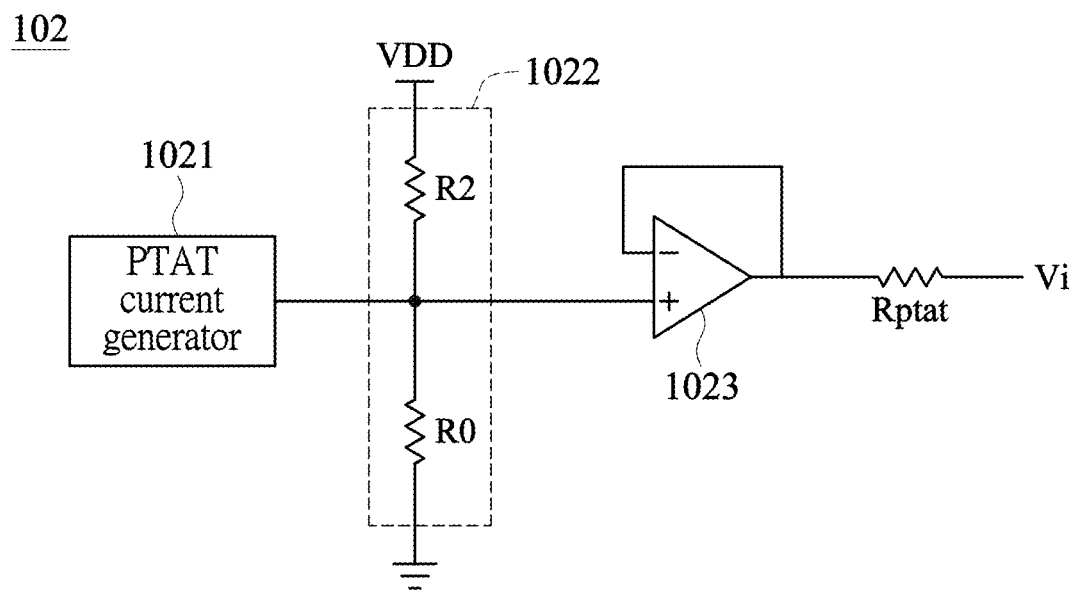
FIG. 3 shows a block diagram illustrating the temperature compensator of FIG. 1A.

FIG. 3 shows a block diagram illustrating the temperature compensator 102 of FIG. 1A. Specifically, the temperature compensator 102 of the embodiment may include a proportional-to-absolute-temperature (PTAT) current generator 1021 configured to generate a PTAT current that increases with increasing temperature or vice versa. The temperature compensator 102 may include a voltage divider 1022 coupled to receive the PTAT current. In the embodiment, the voltage divider 1022 may include a top resistor R2 and a bottom resistor R0 connected in series between the supply voltage VDD and the ground, with an interconnected node (between the top resistor R2 and the bottom resistor R0) that is coupled to receive the PTAT current and is configured to provide the input voltage Vi (to the RC-based VCO 101) via a buffer 1023 (e.g., unit-gain operational amplifier) and a PTAT resistor Rptat. In one exemplary embodiment, the voltage divider 1022 is a copy of the voltage divider 121 of the compare circuit 12 (i.e., with the same top resistor R2 and the bottom resistor R0), and is configured to track the supply voltage VDD, thereby alleviating supply voltage variation effect.

Figure 4A:
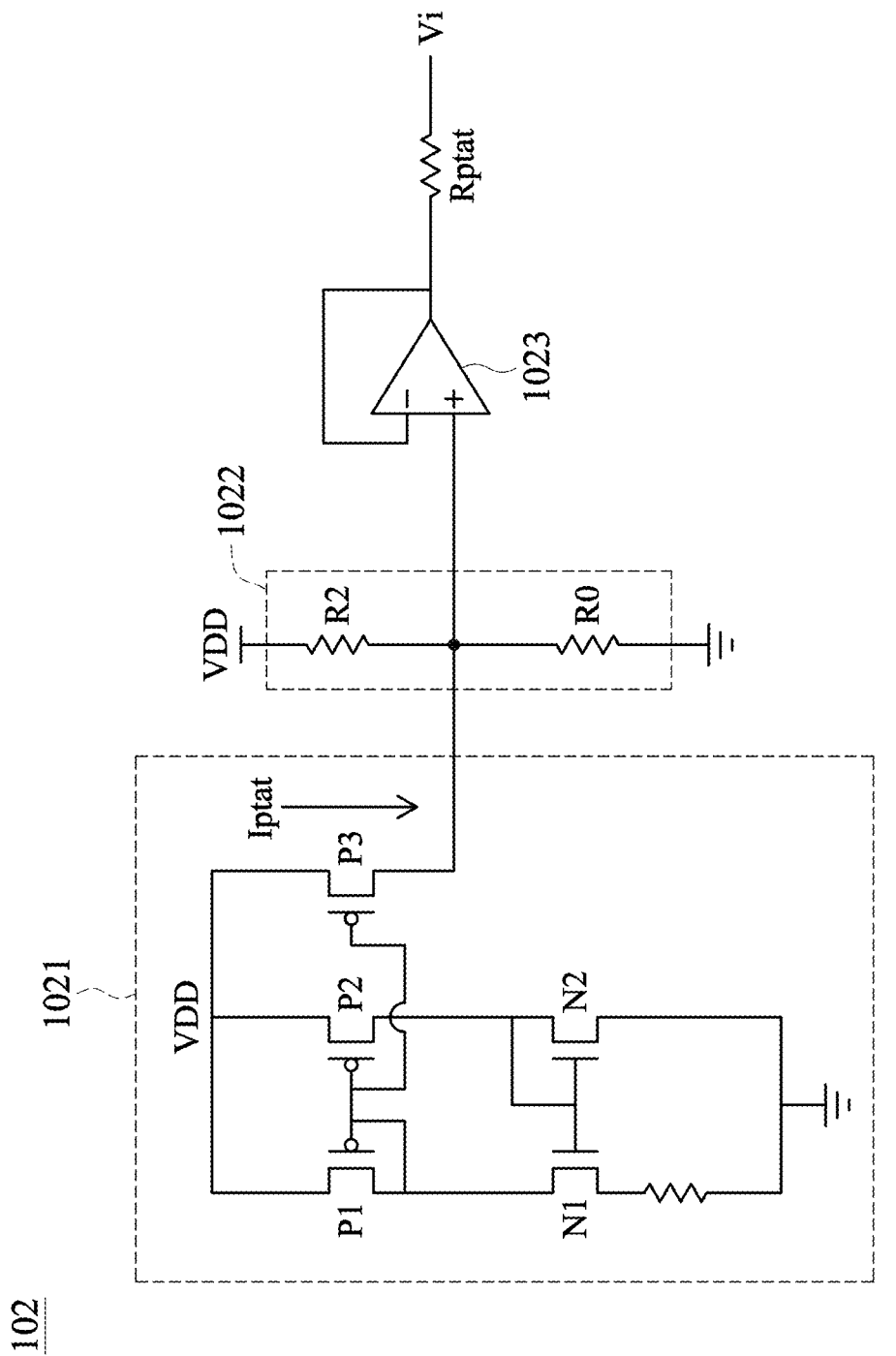
FIG. 4A shows a circuit diagram illustrating the temperature compensator of FIG. 3 according to one embodiment of the present invention.

FIG. 4A shows a circuit diagram illustrating the temperature compensator 102 of FIG. 3 according to one embodiment of the present invention. In the embodiment, the pull-up resistor R1 (of the RC-based VCO 101) has a positive temperature coefficient such that resistance of the pull-up resistor R1 increases with increasing temperature.

In the embodiment, the PTAT current generator 1021 may include a current mirror configured to provide a PTAT current Iptat. Specifically, the current mirror may include a first stage composed of a first P-type metal-oxide-semiconductor (PMOS) transistor P1 (with drain and gate connected) and a first N-type MOS (NMOS) transistor N1 connected in series between the supply voltage VDD and the ground. The current mirror may include a second stage composed of a second PMOS transistor P2 and a second NMOS transistor N2 (with drain and gate connected) connected in series between the supply voltage VDD and the ground. The current mirror may include a third stage composed of a third PMOS transistor P3 (connected between the supply voltage VDD and the interconnected node of the voltage divider 1022), through which the PTAT current Iptat flows. Gates of the first PMOS transistor P1, the second PMOS transistor P2 and the third PMOS transistor P3 are coupled together, and gates of the first NMOS transistor N1 and the second NMOS transistor N2 are coupled together.

According to the temperature compensator 102 of FIG. 4A, when the temperature increases, the pull-up resistor R1 (with positive temperature coefficient) accordingly increases, thereby decreasing the input voltage Vi, which can be compensated by the increasing input voltage Vi provided by the temperature compensator 102 of FIG. 4A due to more PTAT current Iptat flowing through the bottom resistor R0 (of the voltage divider 1022).

Figure 4B:
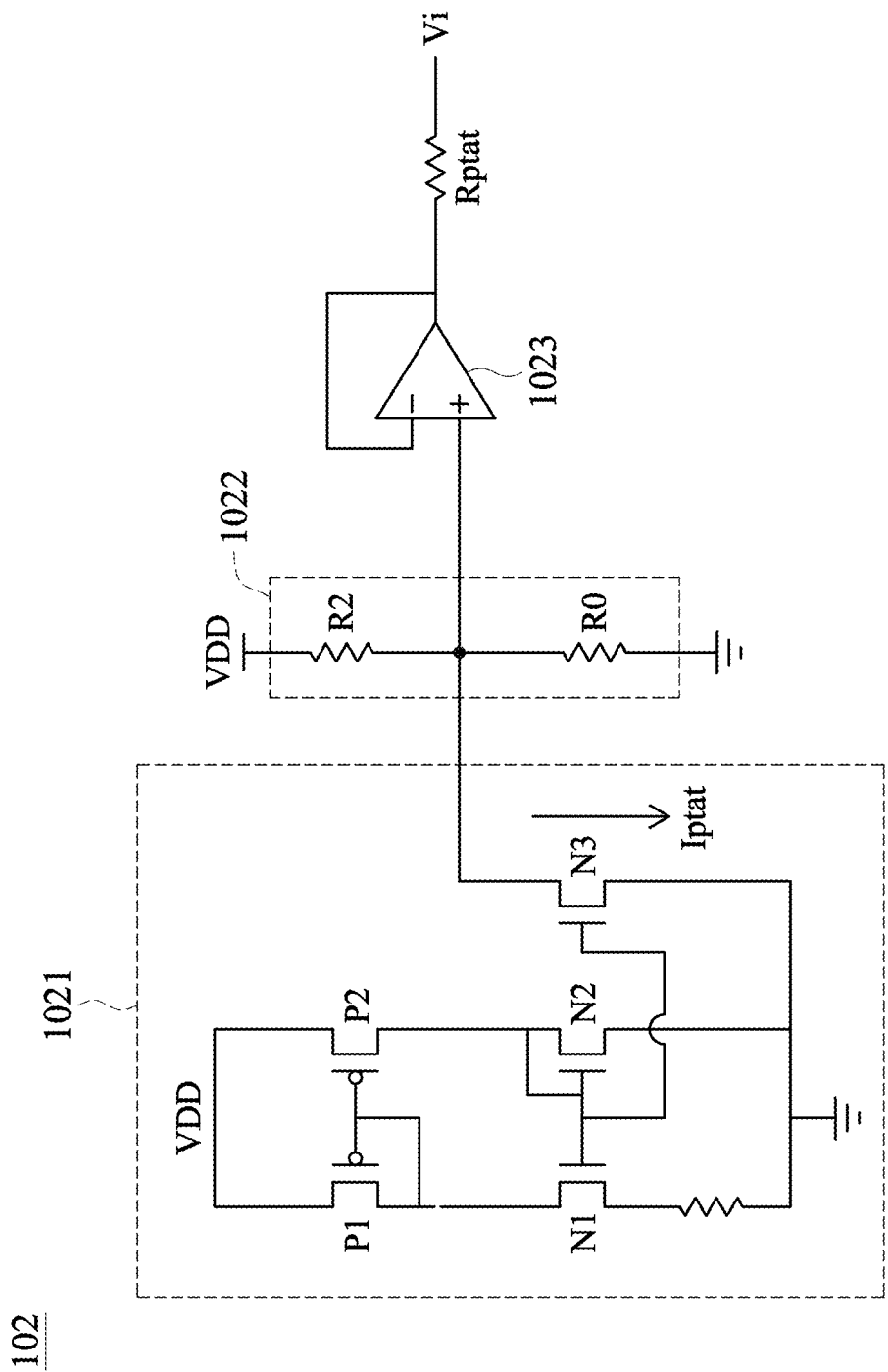
FIG. 4B shows a circuit diagram illustrating the temperature compensator of FIG. 3 according to another embodiment of the present invention.

FIG. 4B shows a circuit diagram illustrating the temperature compensator 102 of FIG. 3 according to another embodiment of the present invention. In the embodiment, the pull-up resistor R1 (of the RC-based VCO 101) has a negative temperature coefficient such that resistance of the pull-up resistor R1 decreases with increasing temperature.

In the embodiment, the PTAT current generator 1021 may include a current mirror configured to provide a PTAT current Iptat. Specifically, the current mirror may include a first stage composed of a first PMOS transistor P1 (with drain and gate connected) and a first NMOS transistor N1 connected in series between the supply voltage VDD and the ground. The current mirror may include a second stage composed of a second PMOS transistor P2 and a second NMOS transistor N2 (with drain and gate connected) connected in series between the supply voltage VDD and the ground. The current mirror may include a third stage composed of a third NMOS transistor N3 (connected between the interconnected node of the voltage divider 1022), through which the PTAT current Iptat flows. Gates of the first PMOS transistor P1 and the second PMOS transistor P2 are coupled together, and gates of the first NMOS transistor N1, the second NMOS transistor N2 and the third NMOS transistor N3 are coupled together.

According to the temperature compensator 102 of FIG. 4B, when the temperature increases, the pull-up resistor R1 (with negative temperature coefficient) accordingly decreases, thereby increasing the input voltage Vi, which can be compensated by the decreasing input voltage Vi provided by the temperature compensator 102 of FIG. 4A due to more PTAT current Iptat flowing through the top resistor R2 (of the voltage divider 1022).

Although specific embodiments have been illustrated and described, it will be appreciated by those skilled in the art that various modifications may be made without departing from the scope of the present invention, which is intended to be limited solely by the appended claims.

What is claimed is:

1. A clock generator, comprising:
    a resistor-capacitor-based voltage-controlled oscillator (RC-based VCO) that generates an output signal with oscillation frequency controlled by an input voltage at an input node; and
    a temperature compensator that generates the input voltage to compensate change of the oscillation frequency associated with a change in temperature;
    wherein the temperature compensator comprises:
        a proportional-to-absolute-temperature (PTAT) current generator that generates a PTAT current increasing with increasing temperature;
        a voltage divider connected between a supply voltage and ground, with an interconnected node coupled to receive the PTAT current;
    wherein the PTAT current flows through an output node of the PTAT current generator, and said output node is directly connected to the interconnected node of the voltage divider, such that the PTAT current flows directly into or out of the interconnected node of the voltage divider.

2. The clock generator of claim 1, wherein the temperature compensator comprises:
    a PTAT resistor electrically connected between the interconnected node of the voltage divider and the input node.

3. The clock generator of claim 2, wherein the voltage divider comprises:
    a top resistor and a bottom resistor interconnected at the interconnected node, with the top resistor connected between the supply voltage and the interconnected node and with the bottom resistor connected between the interconnected node and the ground, with the interconnected node that is configured to provide the input voltage.

4. The clock generator of claim 3, wherein the temperature compensator further comprises:

a buffer, connected with the PTAT resistor in series between the interconnected node of the voltage divider and the input node.

5. The clock generator of claim 3, wherein the PTAT current generator comprises a current mirror.

6. The clock generator of claim 5, wherein the current mirror comprises:
a first stage composed of a first P-type metal-oxide-semiconductor (PMOS) transistor and a first N-type MOS (NMOS) transistor interconnected at a first common node, with the first PMOS transistor connected between the supply voltage and the first common node and with the first NMOS transistor connected between the first common node and the ground, the first PMOS transistor having drain and gate connected;
a second stage composed of a second PMOS transistor and a second NMOS transistor interconnected at a second common node, with the second PMOS transistor connected between the supply voltage and the second common node and with the second NMOS transistor connected between the second common node and the ground, the second NMOS transistor having drain and gate connected; and
a third stage composed of a third PMOS transistor through which the PTAT current flows, the third PMOS transistor being connected between the supply voltage and the interconnected node of the voltage divider;
wherein gates of the first PMOS transistor, the second PMOS transistor and the third PMOS transistor are coupled together, and gates of the first NMOS transistor and the second NMOS transistor are coupled together.

7. The clock generator of claim 5, wherein the current mirror comprises:
a first stage composed of a first PMOS transistor and a first NMOS transistor interconnected at a first common node, with the first PMOS transistor connected between the supply voltage and the first common node and with the first NMOS transistor connected between the first common node and the ground, the first PMOS transistor having drain and gate connected;
a second stage composed of a second PMOS transistor and a second NMOS transistor interconnected at a second common node, with the second PMOS transistor connected between the supply voltage and the second common node and with the second NMOS transistor connected between the second common node and the ground, the second NMOS transistor having drain and gate connected; and
a third stage composed of a third NMOS transistor through which the PTAT current flows, the third NMOS transistor being connected between the ground and the interconnected node of the voltage divider;
wherein gates of the first PMOS transistor and the second PMOS transistor are coupled together, and gates of the first NMOS transistor, the second NMOS transistor and the third NMOS transistor are coupled together.

8. The clock generator of claim 1, wherein the RC-based VCO comprises:
a voltage-controlled oscillator (VCO) that generates the output signal with oscillation frequency controlled by a control voltage;
a compare circuit that generates the control voltage by comparing the input voltage with a reference voltage; and
a pull-up resistor and a switched-capacitor resistor interconnected at the input node, with the pull-up resistor connected between the supply voltage and the input node and with the switched-capacitor resistor connected between the input node and the ground.

9. The clock generator of claim 8, wherein the VCO comprises a ring oscillator.

10. The clock generator of claim 9, wherein the ring oscillator comprises:
an odd number of inverters connected in series;
wherein an output of a last inverter is fed back into a first inverter.

11. The clock generator of claim 8, wherein the compare circuit comprises:
a second voltage divider that generates the reference voltage; and
a comparator that compares the input voltage with the reference voltage.

12. The clock generator of claim 8, wherein the switched-capacitor resistor comprises:
a first switch and a second switch interconnected at a common node, with the first switch connected between the input node and the common node and with the second switch connected between the common node and the ground, the second switch being controlled by the output signal and the first switch being controlled by an inverted output signal; and
a capacitor connected between the ground and the common node.

* * * * *